US010861381B1

(12) United States Patent
Chen (10) Patent No.: US 10,861,381 B1
(45) Date of Patent: Dec. 8, 2020

(54) MICRO LIGHT-EMITTING DIODE DISPLAY HAVING TWO OR MORE TYPES OF DATA LINES

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/432,946

(22) Filed: Jun. 6, 2019

(51) Int. Cl.
*G09G 3/32* (2016.01)
*H01L 25/075* (2006.01)

(52) U.S. Cl.
CPC ........... *G09G 3/32* (2013.01); *H01L 25/0753* (2013.01); *G09G 2300/08* (2013.01); *G09G 2310/027* (2013.01)

(58) Field of Classification Search
CPC ................ G09G 3/32; G09G 2300/08; G09G 2310/027; G09G 3/3233; G09G 3/3266; G09G 3/3258; G09G 3/3275; G09G 3/3291; G09G 3/3225; H01L 27/3241; H01L 27/3244; H01L 27/3276; H01L 27/3288; H01L 27/3297; H01L 27/3242
See application file for complete search history.

(56) References Cited

U.S. PATENT DOCUMENTS

| | | | | |
|---|---|---|---|---|
| 10,026,757 B1* | 7/2018 | Chang | ................ | H01L 27/1248 |
| 2008/0284354 A1* | 11/2008 | Chen | ...................... | H05B 45/00 |
| | | | | 315/294 |
| 2010/0253713 A1* | 10/2010 | Kasai | ................... | G09G 3/3225 |
| | | | | 345/690 |
| 2015/0009108 A1* | 1/2015 | Song | ..................... | H01L 27/124 |
| | | | | 345/80 |
| 2015/0015468 A1* | 1/2015 | Ko | ........................ | G09G 3/3233 |
| | | | | 345/82 |
| 2015/0115293 A1* | 4/2015 | Wu | ......................... | H01L 24/24 |
| | | | | 257/88 |
| 2015/0331285 A1* | 11/2015 | Bibl | ....................... | H01L 33/50 |
| | | | | 362/84 |
| 2016/0148916 A1* | 5/2016 | Higginson | ............. | H01L 25/167 |
| | | | | 257/13 |
| 2017/0025399 A1* | 1/2017 | Takeya | .................... | H05B 33/14 |
| 2020/0111420 A1* | 4/2020 | Yang | ..................... | G09G 3/3233 |

* cited by examiner

*Primary Examiner* — Khiem D Nguyen
(74) *Attorney, Agent, or Firm* — CKC & Partners Co., LLC (57) ABSTRACT

A micro light-emitting diode display including a column of first/second micro light-emitting diodes and a first/second/third/fourth type column data line is provided. The first type column data line is configured to provide first data voltages to some of the first micro light-emitting diodes. The second type column data line is configured to provide second data voltages to a remaining of the first micro light-emitting diodes. The second type column data line is not crossed over by other data lines. The third type column data line is configured to provide third data voltages to some of the second micro light-emitting diodes. The third type column data line is not crossed over by other data lines. The fourth type column data line is configured to provide fourth data voltages to a remaining of the second micro light-emitting diodes.

19 Claims, 5 Drawing Sheets

MICRO LIGHT-EMITTING DIODE DISPLAY HAVING TWO OR MORE TYPES OF DATA LINES

BACKGROUND

Field of Invention

The present disclosure relates to a micro light-emitting diode display.

Description of Related Art

The statements in this section merely provide background information related to the present disclosure and do not necessarily constitute prior art.

In recent years, light-emitting diodes (LEDs) have become popular in general and commercial lighting applications. As a size of one LED become much smaller compared to conventional LEDs, new issues emerge. As such, some novel displays with improvements on circuit layouts to achieve benefits or to solve problems for displays having LEDs with smaller size may become a promising research direction.

SUMMARY

According to some embodiments of the present disclosure, a micro light-emitting diode display is provided. The micro light-emitting diode display includes a substrate, a column of first micro light-emitting diodes, a column of second micro light-emitting diodes, a plurality of row scan lines, a first type column data line, a second type column data line, a third type column data line, and a fourth type column data line. The column of the first micro light-emitting diodes are on the substrate. Each of the first micro light-emitting diodes has a first top surface and a first bottom surface. The column of the second micro light-emitting diodes are on the substrate. Each of the second micro light-emitting diodes has a second top surface and a second bottom surface. Each of the row scan lines is electrically connected to one of the first top surfaces and one of the second top surfaces. The row scan lines are configured to provide a scan-on voltage and a scan-off voltage to said one of the first top surfaces, and to one of the second top surfaces. The first type column data line is configured to provide first data voltages to some of the first micro light-emitting diodes through the first bottom surfaces. The second type column data line is configured to provide second data voltages to a remaining of the first micro light-emitting diodes through the first bottom surfaces, in which the second type column data line is not crossed over by other data lines. The third type column data line is configured to provide third data voltages to some of the second micro light-emitting diodes through the second bottom surfaces, in which the third type column data line is not crossed over by other data lines. The fourth type column data line is configured to provide fourth data voltages to a remaining of the second micro light-emitting diodes through the second bottom surfaces.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 2' is a schematic cross-sectional view of a light-emitting diode display taken along line B-B' shown in FIG. 1 according to some embodiments of the present disclosure;

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1:
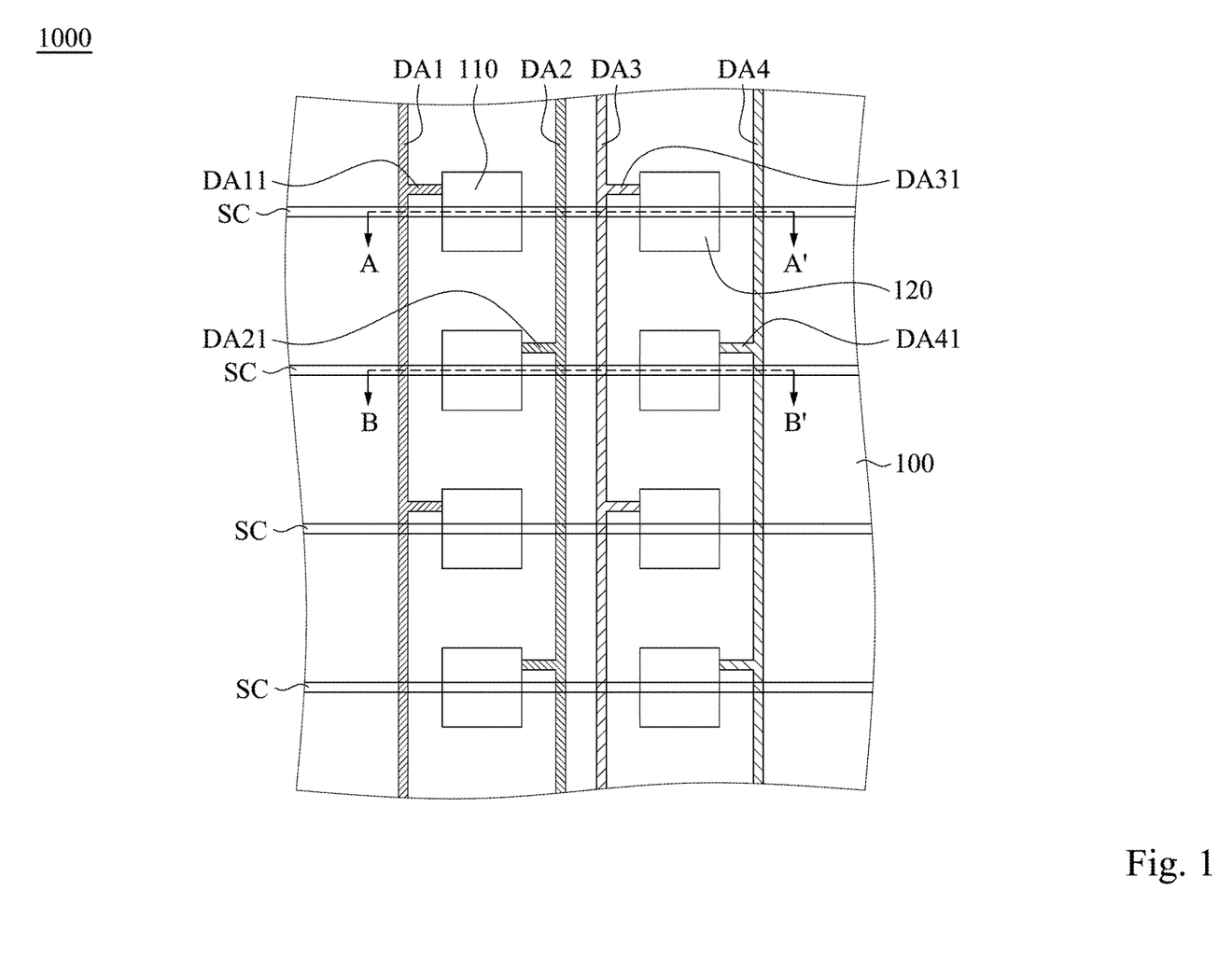
FIG. 1 is a schematic diagram illustrating electrical connections of a portion of a micro light-emitting diode display according to some embodiments of the present disclosure.
Figure 2:
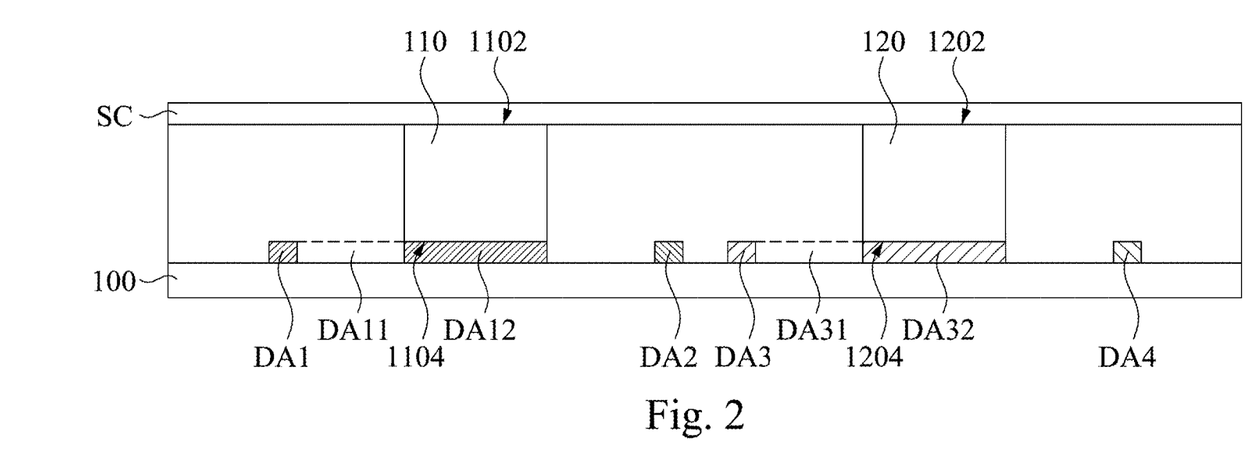
FIG. 2 is a schematic cross-sectional view of a light-emitting diode display taken along line A-A' shown in FIG. 1 according to some embodiments of the present disclosure.

Reference is made to FIGS. 1 and 2. FIG. 1 is a schematic diagram illustrating electrical connections of a portion of a micro light-emitting diode display 1000. FIG. 2 is a schematic cross-sectional view of the micro light-emitting diode display 1000 taken along a line A-A' shown in FIG. 1. FIG. 2' is a schematic cross-sectional view of the micro light-emitting diode display 1000 along a line B-B' shown in FIG. 1. A micro light-emitting diode display 1000 is provided. The micro light-emitting diode display 1000 includes a substrate 100, a column of first micro light-emitting diodes 110, a column of second micro light-emitting diodes 120, a plurality of row scan lines SC, a first type column data line DA1, a second type column data line DA2, a third type column data line DA3, and a fourth type column data line DA4. The column of the first micro light-emitting diodes 110 are on the substrate 100. Each of the first micro light-emitting diodes 110 has a first top surface 1102 and a first bottom surface 1104. The column of the second micro light-emitting diodes 120 are on the substrate 100. Each of the second micro light-emitting diodes 120 has a second top surface 1202 and a second bottom surface 1204. In some embodiments, each of the row scan lines SC is electrically connected to one of the first top surfaces 1102 and one of the second top surfaces 1202. Each of the row scan lines SC are configured to provide a scan-on voltage and a scan-off voltage to one of the first top surfaces 1102, and to one of the second top surfaces 1202.

In some embodiments, the first type column data line DA1 is configured to provide first data voltages to some of the first micro light-emitting diodes 110 through the first bottom surfaces 1104 thereof. In some embodiments, the second type column data line DA2 is configured to provide second data voltages to a remaining of the first micro light-emitting diodes 110 through the first bottom surfaces 1104 thereof. In some embodiments, there are auxiliary portions DA11 and DA12 so that the first type column data line DA1 is electrically connected to (or in contact with) one of the first micro light-emitting diodes 110 as shown in FIG. 2. In some embodiments, there are auxiliary portions DA21 and DA22 so that the second type column data line DA2 is electrically connected to (or in contact with) one of the first micro light-emitting diodes 110 as shown in FIG. 2'. In some embodiments, there are auxiliary portions DA31 and DA32 so that the third type column data line DA3 is electrically connected to (or in contact with) one of the second micro light-emitting diodes 120 as shown in FIG. 2. In some embodiments, there are auxiliary portions DA41 and DA42 so that the fourth type column data line DA4 is electrically connected to (or in contact with) one of the second micro light-emitting diodes 120 as shown in FIG. 2'.

Normally, the row scan lines SC provide only two values of voltage levels (i.e., the scan-on voltage and the scan-off voltage to respectively light up and turn off light-emitting diodes), and the first, second, third, fourth column data lines DA1, DA2, DA3, and DA4 respectively provide grayscale voltage levels to determine light intensities of the light-emitting diodes.

Figure 3:
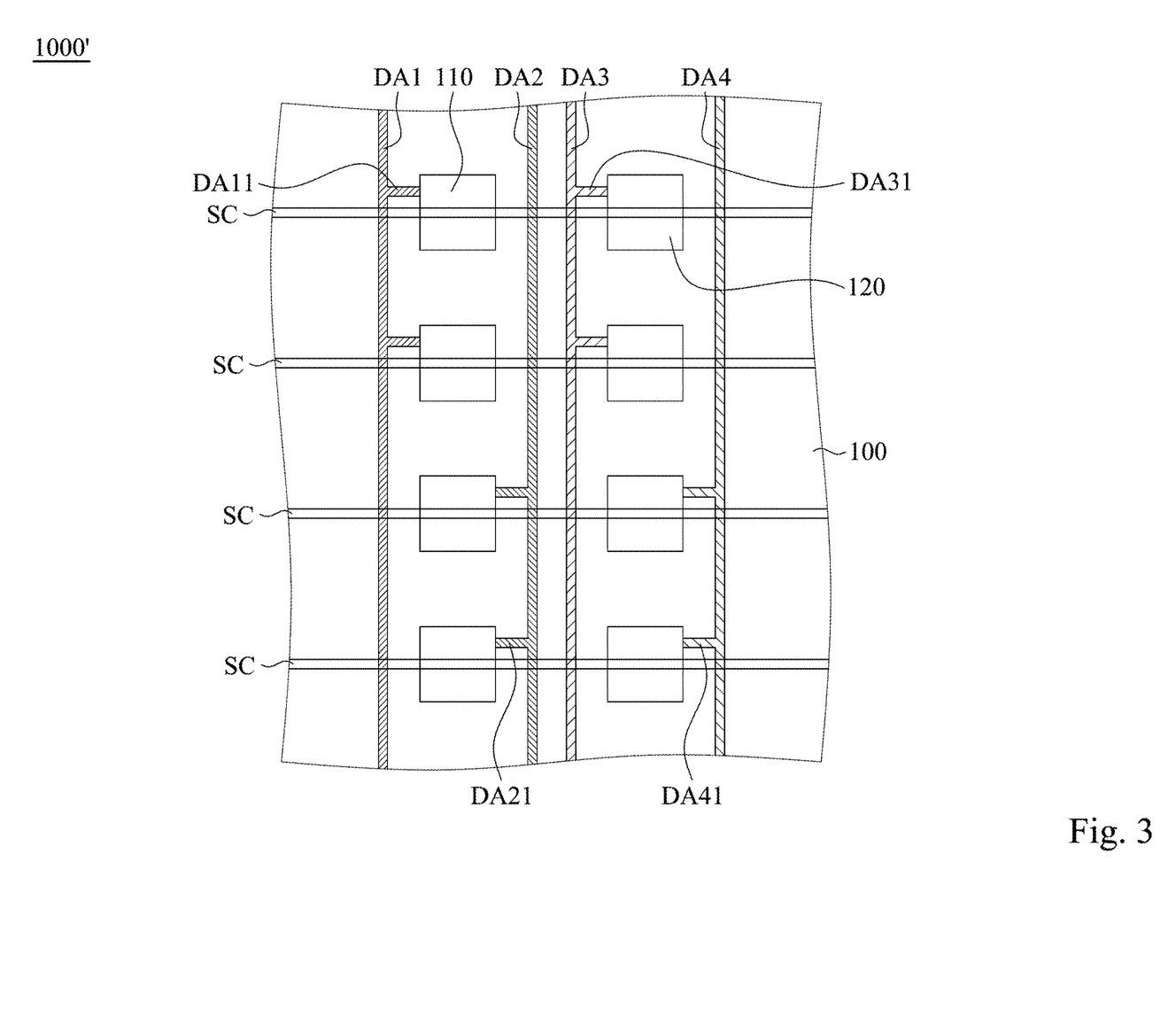
FIG. 3 is a schematic diagram illustrating electrical connections of a portion of a micro light-emitting diode display according to some embodiments of the present disclosure.

FIG. 3 is a schematic diagram illustrating electrical connections of a portion of a micro light-emitting diode display 1000'. In some embodiments, the first type column data line DA1 is configured to provide the first data voltages to half of the first micro light-emitting diodes 110 through the first bottom surfaces 1104 thereof, and the second type column data line DA2 is configured to provide second data voltages to the other half of the first micro light-emitting diodes 110 through the first bottom surfaces 1104 thereof. In some embodiments, the half of the first micro light-emitting diodes 110 as mentioned are arranged at upper half positions of the column of the first micro light-emitting diodes 110 (see FIG. 3).

It is noted that FIG. 3 is only used to give a hint that "the half" of the first micro light-emitting diodes 110 are arranged at upper two positions of the column in the above embodiments. In some other cases, there can have more than four diodes in one column. For example, if there are one hundred first micro light-emitting diodes 110 in one column, then "the half" of the first micro light-emitting diodes 110 will be the upper fifty of the first micro light-emitting diodes 110. In some other embodiments, the half of the first micro light-emitting diodes 110 as mentioned are arranged at lower half positions of the column of the first micro light-emitting diodes 110. In some embodiments, the some of the first micro light-emitting diodes 110 as mentioned are arranged at odd positions of the column of the first micro light-emitting diodes 110, and the remaining of the first micro light-emitting diodes 110 are arranged at even positions of the column of the first micro light-emitting diodes 110 (see FIG. 1). In some other embodiments, the some of the first micro light-emitting diodes 110 as mentioned are arranged at even positions of the column of the first micro light-emitting diodes 110, and the remaining of the first micro light-emitting diodes 110 are arranged at odd positions of the column of the first micro light-emitting diodes 110.

In some embodiments, the second type column data line DA2 is not crossed over by other data lines, which means that all types of column data lines DA1, DA2, DA3, and DA4 (also, DA5 and DA6 which will be illustrated in other embodiments later) present in the embodiments of the present disclosure are on the same "layer" during the manufacturing processes of the micro light-emitting diode display 1000. In other words, all types of column data lines can be manufactured in the same set of processes. Specifically, the "not crossed over" as mentioned is represented from a view angle as shown in FIG. 1. The meaning of "not crossed over" will not be repeated again in the following content.

The third type column data line DA3 is configured to provide third data voltages to some of the second micro light-emitting diodes 120 through the second bottom surfaces 1204. In some embodiments, the third type column data line DA3 is configured to provide the third data voltages to half of the second micro light-emitting diodes 120 through the second bottom surfaces 1204. In some embodiments, the some of the second micro light-emitting diodes 120 as mentioned are arranged at odd positions of the column of the second micro light-emitting diodes 120, and the remaining of the second micro light-emitting diodes 120 are arranged at even positions of the column of the second micro light-emitting diodes 120 (see FIG. 1). In some other embodiments, the some of the second micro light-emitting diodes 120 as mentioned are arranged at even positions of the column of the second micro light-emitting diodes 120, and the remaining of the second micro light-emitting diodes are arranged at odd positions of the column of the second micro light-emitting diodes. In some embodiments, the third type column data line DA3 is not crossed over by other data lines. The fourth type column data line DA4 is configured to provide fourth data voltages to a remaining of the second micro light-emitting diodes 120 through the second bottom surfaces 1204.

The above embodiments which can be illustrated or hinted by FIGS. 1 to 3 are able to decrease a frame time since two types of data lines which can be individually controlled are used simultaneously to provide data voltages (e.g., first data voltages and second data voltages) to the same column but different light-emitting diodes (e.g., the upper half and the lower half of the first type light-emitting diodes 110 or the odd positions and the even positions of the first type light-emitting diodes 110). As an example, two of the row scan lines SC provide the scan-on voltage to two of the first micro light-emitting diodes 110, and the first type column data line DA1 and the second type column data line DA2 respectively provide one of the first data voltages and one of the second data voltages to light up said two of the first micro light-emitting diodes 110 with specified light intensities. As such, one frame time can be decreased.

On the other hand, one can choose not to decrease the frame time but increase a dynamic range of the first micro light-emitting diodes 110 and/or the second micro light-emitting diodes 120 by increasing a time period for lighting up one of the first light-emitting diodes 110 and/or one of the second light-emitting diodes 120. Specifically, in a conventional layout there is 1/N of one frame time to light up one of the first micro light-emitting diodes 110 assuming a number of the first micro light-emitting diodes 110 is N. Using the layout in the embodiments of the present disclosure as mentioned above, there is 2/N of one frame time to light up one of the first micro light-emitting diodes 110 when there are half of the first micro light-emitting diodes 110 electrically connected to and controlled by the first type column data line DA1, and another half of the first micro light-emitting diodes 110 electrically connected to and controlled by the second type column data line DA2. It is noted that a combination of simultaneously decreasing the frame time and increasing the dynamic range as mentioned is also within the scope of the present disclosure.

The row scan lines SC other than the two as mentioned provide the scan-off voltage such that the first micro light-emitting diodes 110 other than said two of the first micro light-emitting diodes 110 are not lighted up. It is noted that the method of driving the column of the first micro light-emitting diodes 110 can be adopted to driving the column of the second micro light-emitting diodes 120 with the first type column data line DA1 and the second type column data line DA2 respectively replaced by the third type column data line DA3 and the fourth type column data line DA4, and will not be repeated again.

In some embodiments, lateral lengths of each of the first micro light-emitting diodes 110 and the second micro light-emitting diodes 120 are smaller than or equal to about 100 μm. The restriction of the lateral lengths as mentioned helps to realize the layouts in the embodiments of the present disclosure in which two types of column data lines are on opposite sides of one column of light-emitting diodes, and two types of column data lines are between two columns of light-emitting diodes. If a lateral length of a light-emitting diode is too large, there is no enough space to realize the embodiments as mentioned in the present disclosure. Specifically, in some embodiments, the first type column data line DA1 and the second type column data line DA2 are on opposite sides of the column of the first micro light-emitting diodes 110. In some embodiments, the second type column data line DA2 and the third type column data line DA3 are between the column of the first micro light-emitting diodes 110 and the column of the second micro light-emitting diodes 120. In some embodiments, the third type column data line DA3 and the fourth type column data line DA4 are on opposite sides of the column of the second micro light-emitting diodes 120.

Figure 4:
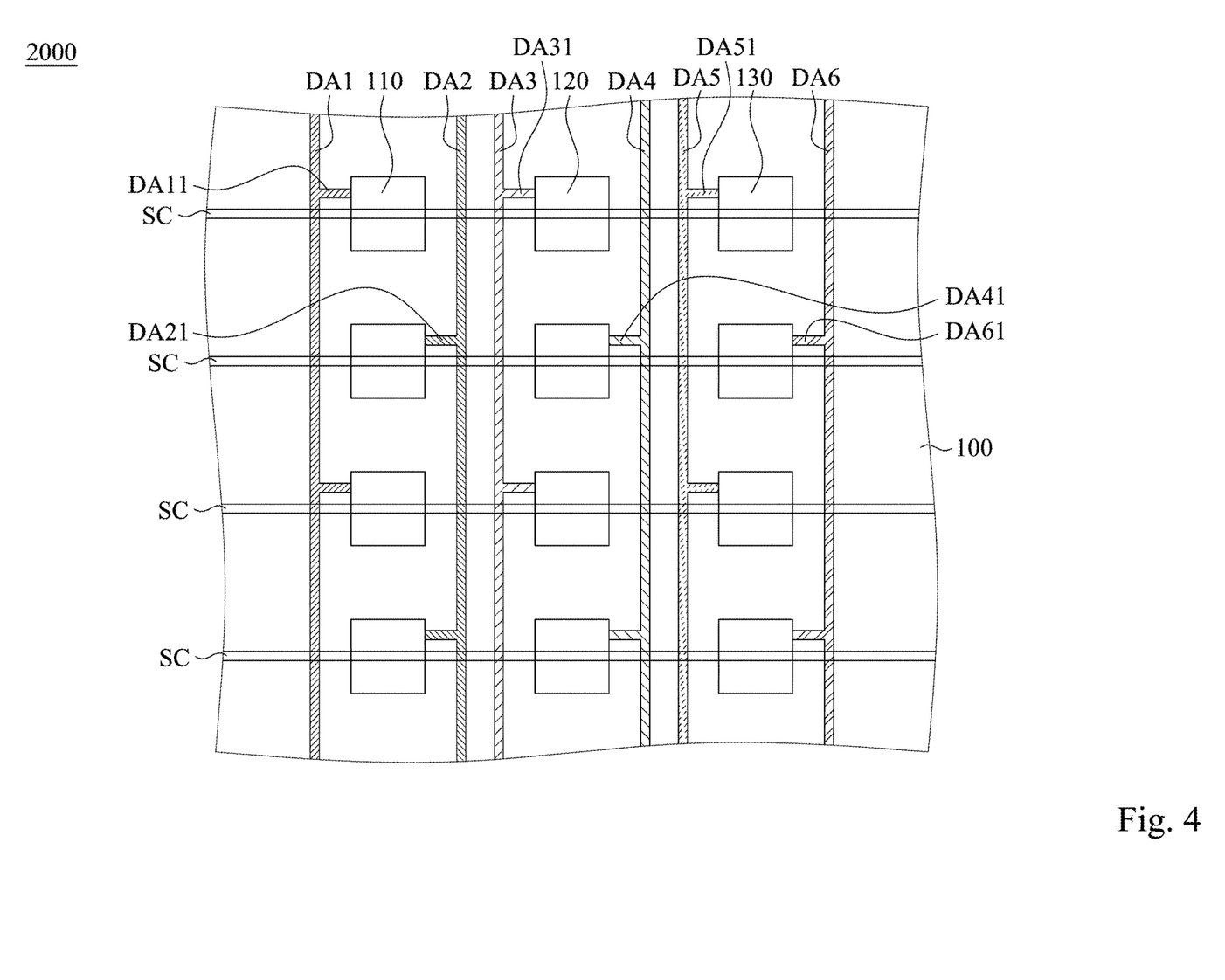
FIG. 4 is a schematic diagram illustrating electrical connections of a portion of a micro light-emitting diode display according to some embodiments of the present disclosure.
Figure 5:
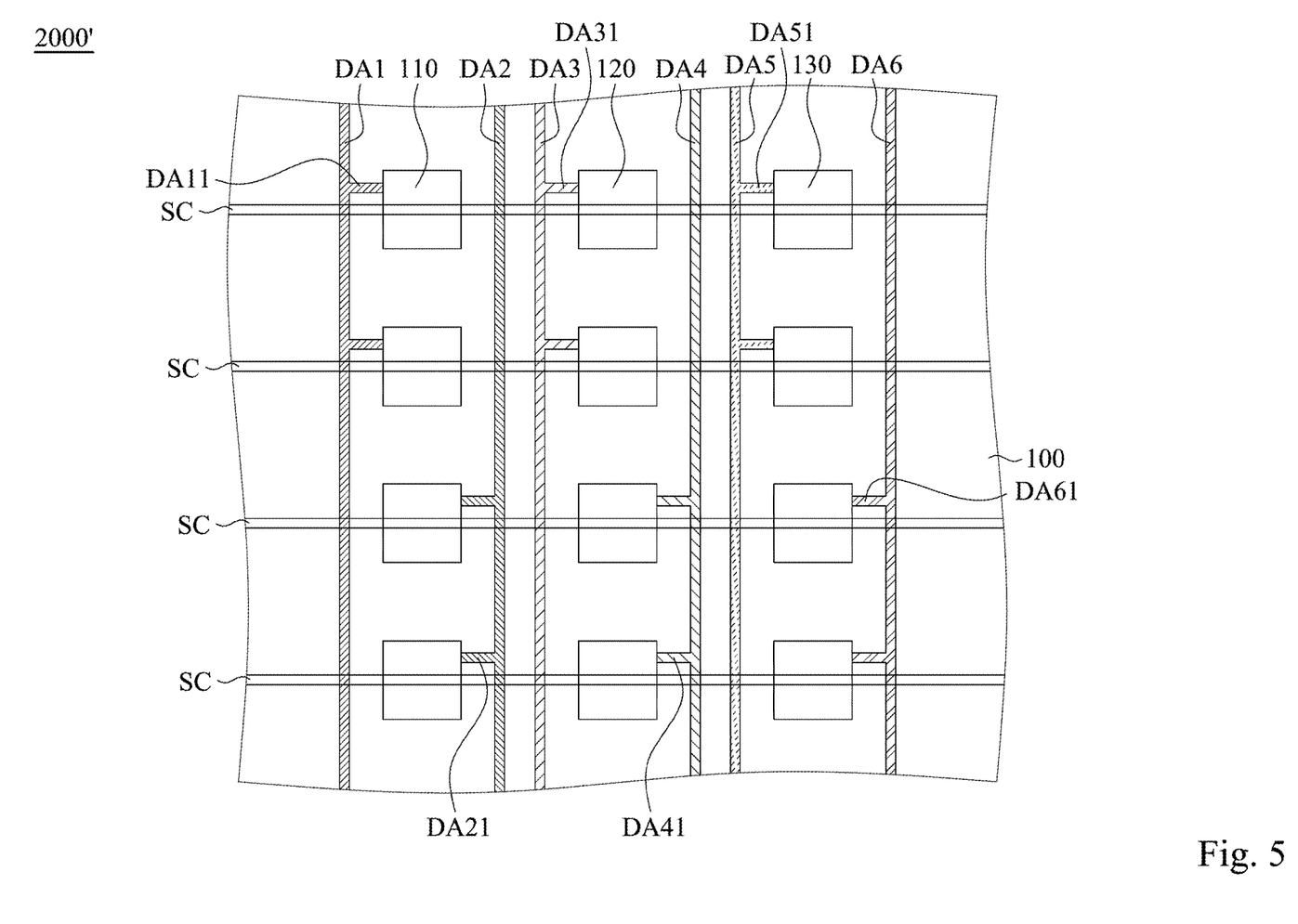
FIG. 5 is a schematic diagram illustrating electrical connections of a portion of a micro light-emitting diode display according to some embodiments of the present disclosure.

Reference is made to FIGS. 4 and 5. FIG. 4 is a schematic diagram illustrating electrical connections of a portion of a micro light-emitting diode display 2000. FIG. 5 is a schematic diagram illustrating electrical connections of a portion of a micro light-emitting diode display 2000'. In some embodiments, the micro light-emitting diode display 2000 or 2000' further includes a column of third micro light-emitting diodes 130, a fifth type column data line DA5, and a sixth type column data line DA6 as compared to the micro light-emitting diode display 1000 and 1000'. In some embodiments, there are auxiliary portions DA51 and DA61 so that the fifth type column data line DA5 and the sixth type column data line DA6 are electrically connected to (or in contact with) one of the third micro light-emitting diodes 130 as shown in FIGS. 4 and 5. The column of the third micro light-emitting diodes 130 are on the substrate 100. Each of the row scan lines SC is electrically connected to one of the third micro light-emitting diodes 130, and each of the row scan lines SC is configured to provide the scan-on voltage and the scan-off voltage to one of the third micro light-emitting diodes 130. The fifth type column data line DA5 is configured to provide fifth data voltages to some of the third micro light-emitting diodes 130. The fifth type column data line DA5 is not crossed over by other data lines. The sixth type column data line SC6 is configured to provide sixth data voltages to a remaining of the third micro light-emitting diodes 130. In some embodiments, each of the row scan lines SC is electrically connected to a top surface of the third light-emitting diode 130. In some embodiments, the fifth type column data line DA5 is configured to provide the fifth data voltages to some of the third micro light-emitting diodes 130 through bottom surfaces thereof (not shown for the similarity with the embodiments illustrating the first/second micro devices 110, 120). In some embodiments, the sixth type column data line DA6 is configured to provide the sixth data voltages to the remaining of the third micro light-emitting diodes 130 through bottom surfaces thereof (also not shown for the similarity as mentioned).

In some embodiments, the fifth type column data line DA5 is configured to provide the fifth data voltages to half of the third micro light-emitting diodes 130. In some embodiments, the some of the third micro light-emitting diodes 130 as mentioned are arranged at odd positions of the column of the third micro light-emitting diodes 130, and the remaining of the third micro light-emitting diodes 130 are arranged at even positions of the column of the third micro light-emitting diodes 130 (see FIG. 4). In some other embodiments, the some of the third micro light-emitting diodes 130 are arranged at even positions of the column of the third micro light-emitting diodes, and the remaining of the third micro light-emitting diodes 130 are arranged at odd positions of the column of the third micro light-emitting diodes 130. In some embodiments, the half of the third micro light-emitting diodes 130 as mentioned are arranged at upper half positions of the column of the third micro light-emitting diodes 130 (see FIG. 5 as a hint). The fifth type column data line DA5 and the sixth type column data line DA6 are on opposite sides of the column of the third micro light-emitting diodes 130. In some embodiments, the fourth type column data line DA4 and the fifth type column data line DA5 are between the column of the second micro light-emitting diodes 120 and the column of the third micro light-emitting diodes 130. It is noted that the method of driving the column of the first micro light-emitting diodes 110 as mentioned above can be adopted to drive the column of the third micro light-emitting diodes 130 with the first type column data line DA1 and the second type column data line DA2 respectively replaced by the fifth type column data line DA5 and the sixth type column data line DA6.

In summary, a micro light-emitting diode display is provided in which two types of data lines are respectively configured to provide data voltages to different light-emitting diodes in the same column. As such, a frame time can be decreased to enhance the resolution of the micro light-emitting diode display, and/or a dynamic range of the light-emitting diodes in the micro light-emitting diode display can be increased.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro light-emitting diode display, comprising:
a substrate;
a column of first micro light-emitting diodes on the substrate, each of the first micro light-emitting diodes having a first top surface and a first bottom surface;
a column of second micro light-emitting diodes on the substrate, each of the second micro light-emitting diodes having a second top surface and a second bottom surface;
a plurality of row scan lines, each of the row scan lines being electrically connected to the first top surface of one of the first micro light-emitting diodes and the second top surface of one of the second micro light-emitting diodes, configured to provide a scan-on voltage and a scan-off voltage to said first top surface, and to said second top surface;
a first type column data line configured to provide first data voltages to some of the first micro light-emitting diodes through the first bottom surface of each of said some of the first micro light-emitting diodes;
a second type column data line configured to provide second data voltages to a remaining of the first micro light-emitting diodes through the first bottom surface of each of said remaining of the first micro light-emitting diodes;
a third type column data line configured to provide third data voltages to some of the second micro light-emitting diodes through the second bottom surface of each of said some of the second micro light-emitting diodes; and
a fourth type column data line configured to provide fourth data voltages to a remaining of the second micro light-emitting diodes through the second bottom surface of each of said remaining of the second micro light-emitting diodes,
wherein the first type column data line, the second type column data line, the third type column data line, and the fourth type column data line do not cross over each other, and
wherein the first type column data line and the second type column data line are used to simultaneously provide the first data voltages and the second data voltages.

2. The micro light-emitting diode display of claim 1, wherein the first type column data line is configured to provide the first data voltages to half of the first micro light-emitting diodes through the first bottom surfaces.

3. The micro light-emitting diode display of claim 2, wherein said half of the first micro light-emitting diodes are arranged at upper half positions of the column of the first micro light-emitting diodes.

4. The micro light-emitting diode display of claim 2, wherein said half of the first micro light-emitting diodes are arranged at lower half positions of the column of the first micro light-emitting diodes.

5. The micro light-emitting diode display of claim 1, wherein the third type column data line is configured to provide the third data voltages to half of the second micro light-emitting diodes through the second bottom surfaces.

6. The micro light-emitting diode display of claim 1, wherein said some of the first micro light-emitting diodes are arranged at odd positions of the column of the first micro light-emitting diodes, and the remaining of the first micro light-emitting diodes are arranged at even positions of the column of the first micro light-emitting diodes.

7. The micro light-emitting diode display of claim 1, wherein said some of the second micro light-emitting diodes are arranged at odd positions of the column of the second micro light-emitting diodes, and the remaining of the second micro light-emitting diodes are arranged at even positions of the column of the second micro light-emitting diodes.

8. The micro light-emitting diode display of claim 1, wherein said some of the first micro light-emitting diodes are arranged at even positions of the column of the first micro light-emitting diodes, and the remaining of the first micro light-emitting diodes are arranged at odd positions of the column of the first micro light-emitting diodes.

9. The micro light-emitting diode display of claim 1, wherein said some of the second micro light-emitting diodes are arranged at even positions of the column of the second micro light-emitting diodes, and the remaining of the second micro light-emitting diodes are arranged at odd positions of the column of the second micro light-emitting diodes.

10. The micro light-emitting diode display of claim 1, wherein lateral lengths of each of the first micro light-emitting diodes and the second micro light-emitting diodes are smaller than or equal to about 100 µm.

11. The micro light-emitting diode display of claim 1, wherein the first type column data line and the second type column data line are on opposite sides of the column of the first micro light-emitting diodes.

12. The micro light-emitting diode display of claim 1, wherein the second type column data line and the third type column data line are between the column of the first micro light-emitting diodes and the column of the second micro light-emitting diodes.

13. The micro light-emitting diode display of claim 1, wherein the third type column data line and the fourth type column data line are on opposite sides of the column of the second micro light-emitting diodes.

14. The micro light-emitting diode display of claim 1, further comprising:
a column of third micro light-emitting diodes on the substrate, wherein each of the row scan lines is electrically connected to one of the third micro light-emitting diodes, and each of the row scan lines is configured to provide the scan-on voltage and the scan-off voltage to one of the third micro light-emitting diodes;
a fifth type column data line configured to provide fifth data voltages to some of the third micro light-emitting diodes; and
a sixth type column data line configured to provide sixth data voltages to a remaining of the third micro light-emitting diodes.

15. The micro light-emitting diode display of claim 14, wherein the fifth type column data line is configured to provide the fifth data voltages to half of the third micro light-emitting diodes.

16. The micro light-emitting diode display of claim 14, wherein the some of the third micro light-emitting diodes are arranged at odd positions of the column of the third micro light-emitting diodes, and the remaining of the third micro light-emitting diodes are arranged at even positions of the column of the third micro light-emitting diodes.

17. The micro light-emitting diode display of claim 14, wherein the some of the third micro light-emitting diodes are arranged at even positions of the column of the third micro light-emitting diodes, and the remaining of the third micro light-emitting diodes are arranged at odd positions of the column of the third micro light-emitting diodes.

18. The micro light-emitting diode display of claim 14, wherein the fifth type column data line and the sixth type column data line are on opposite sides of the column of the third micro light-emitting diodes.

19. The micro light-emitting diode display of claim 14, wherein the fourth type column data line and the fifth type column data line are between the column of the second micro light-emitting diodes and the column of the third micro light-emitting diodes.

* * * * *